United States Patent [19]
Yasukawa et al.

[11] Patent Number: 5,886,917
[45] Date of Patent: Mar. 23, 1999

[54] SEMICONDUCTOR INTEGRATED CIRCUIT DEVICE

[75] Inventors: Tugumasa Yasukawa; Yoshihiro Ichikawa, both of Tokyo, Japan

[73] Assignee: Kabushiki Kaisha Toshiba, Kawasaki, Japan

[21] Appl. No.: 22,846

[22] Filed: Feb. 12, 1998

[30] Foreign Application Priority Data

Feb. 13, 1997 [JP] Japan ..................................... 9-029284

[51] Int. Cl.⁶ ........................................................ G11C 5/06
[52] U.S. Cl. ............................................... 365/63; 365/51
[58] Field of Search ....................... 365/63, 51; 257/207; 357/34, 41, 71

[56] References Cited

U.S. PATENT DOCUMENTS

| | | | |
|---|---|---|---|
| 5,293,559 | 3/1994 | Kim et al. .................................. | 365/63 |
| 5,321,658 | 6/1994 | Ishimura et al. ........................... | 365/63 |
| 5,426,615 | 6/1995 | Tomishima et al. ....................... | 365/63 |
| 5,687,108 | 11/1997 | Proebsting ................................. | 365/51 |
| 5,699,189 | 12/1997 | Takenaka .................................. | 365/63 |
| 5,748,549 | 5/1998 | Kometani et al. ......................... | 365/63 |

*Primary Examiner*—Son T. Dinh
*Attorney, Agent, or Firm*—Foley & Lardner

[57] ABSTRACT

A semiconductor integrated circuit device has power source lines capable of supplying sufficient power to a cell string area without increasing the area of the device. The device has an I/O cell area arranged at the periphery of the device, to transmit and receive signals to and from the outside of the device. The cell string area contains cell strings each made of a sequence of logic gate cells and connected to the power source lines extending from the I/O cell area. The device further has a macro block between the I/O cell area and the cell string area, to provide at least one function. The power source lines extend from part of the I/O cell area, which is opposite to the cell string area across the macro block, to the cell string area by passing over the macro block. An insulation layer is formed between the macro block and the power source lines, to electrically isolate the macro block from the power source lines.

7 Claims, 9 Drawing Sheets

SEMICONDUCTOR INTEGRATED CIRCUIT DEVICE

BACKGROUND OF THE INVENTION

1. Field of the Invention

The present invention relates to a semiconductor integrated circuit device having an improved arrangement of power source lines and special signal lines such as clock signal lines.

2. Description of the Prior Art

Figure 1:
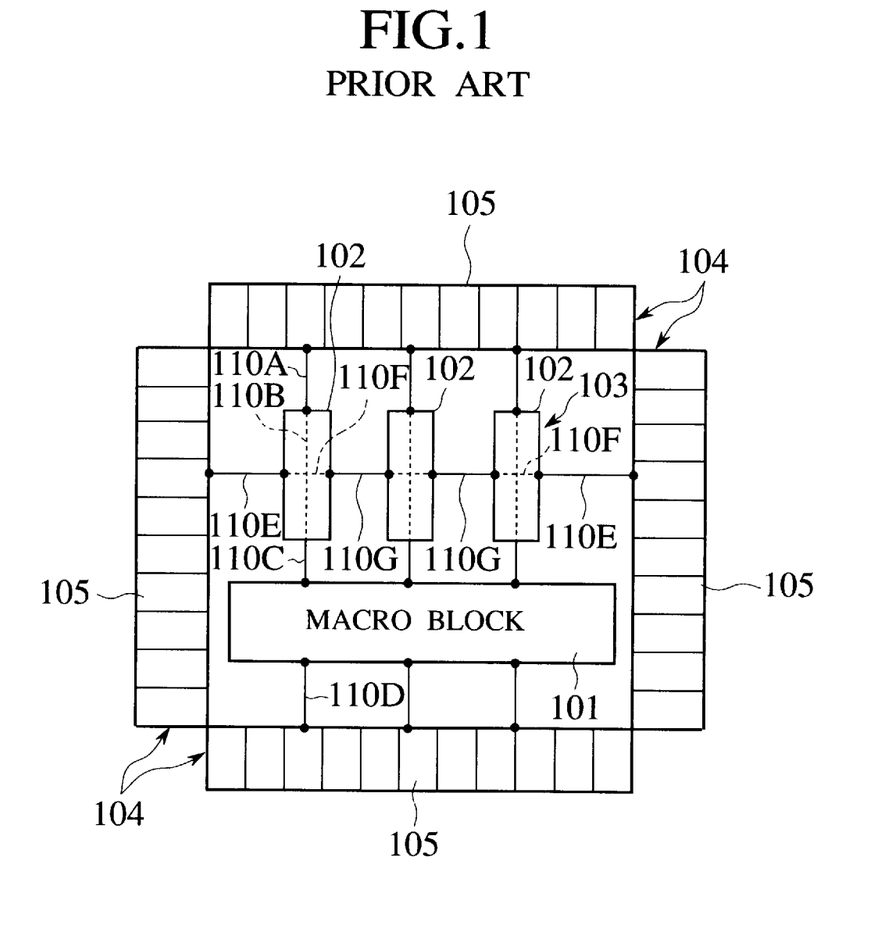
FIG. 1 shows power source lines in a semiconductor integrated circuit device according to a prior art.

FIG. 1 shows an arrangement of power source lines in a semiconductor integrated circuit device according to a prior art. Although actual power source lines include power supply lines and ground lines, the following explanation collectively expresses them as power source lines for the sake of simplicity.

The device includes a macro block 101 to provide at least one function and cell strings 102 that form a cell string area 103. An I/O cell area 104 is formed at the periphery of the device. The macro block 101 includes a CPU and memories such as RAMs and ROMs. Each of the cell strings 102 consists of a sequence of logic gate cells. The I/O cell area 104 includes I/O cells 105 that transmit and receive signals to and from the outside of the device.

The macro block 101 and cell strings 102 receive power from the I/O cells 105. Power source lines 110A extend from corresponding I/O cells 105 directly to the cell strings 102. These lines 110A are connected to power source lines 110B, which are formed in the cell strings 102 and are connected to power source lines 110C.

Power source lines 110D extend from corresponding I/O cells 105 to a power source ring of the macro block 101. The power source ring is connected to the power source lines 110C, which are connected to the cell strings 102.

Power source lines 110E extend from corresponding I/O cells 105 to the cell strings 102. These lines 110E are connected to power source lines 110F, which are formed in the cell strings 102 and are connected to inter-cell power source lines 110G.

Figure 2:
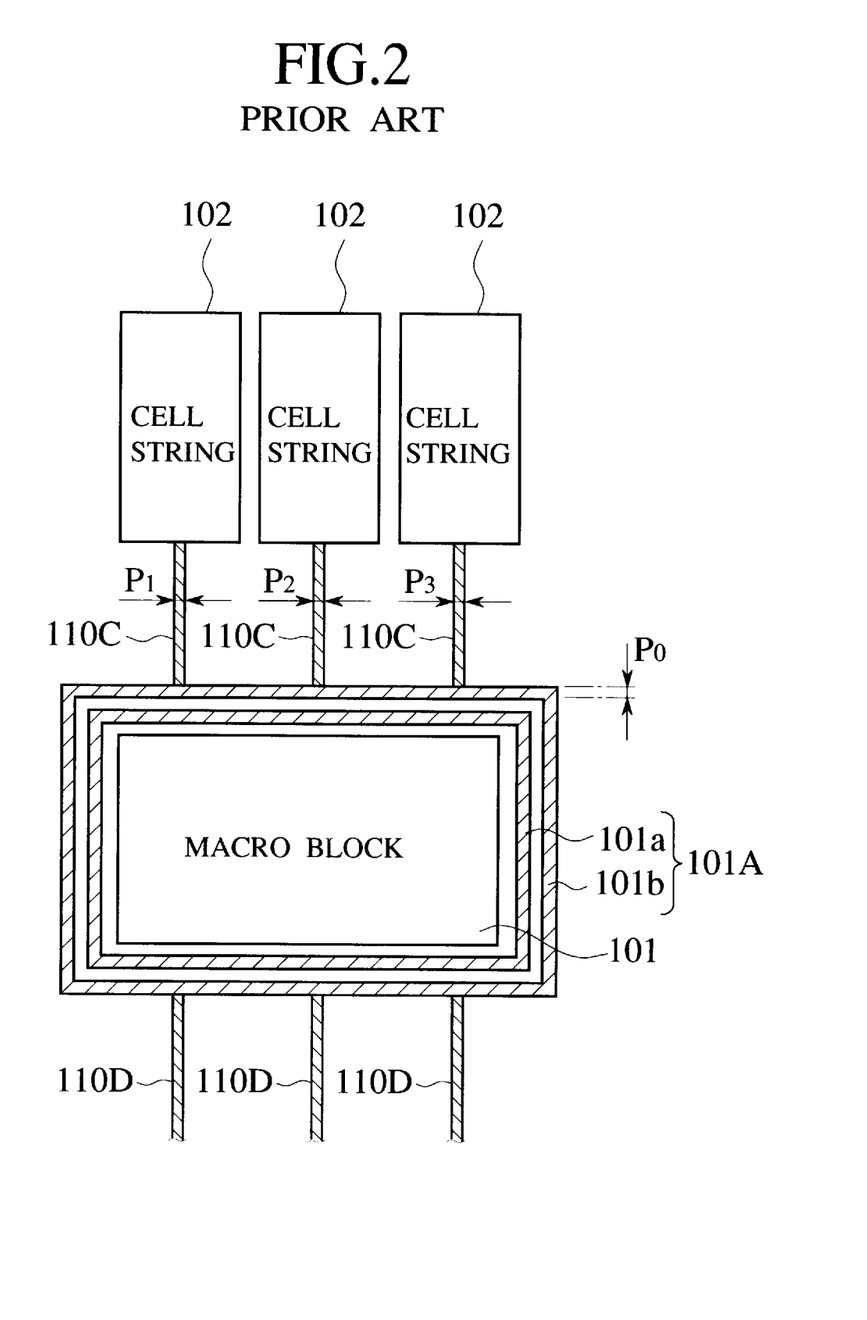
FIG. 2 shows the details of a power source ring formed around a macro block of the device of FIG. 1.

FIG. 2 shows the details of the power source ring formed around the macro block 101.

Due to the limitation of an automatic wiring technique employing, for example, CAD, macro blocks usually have a ring-shaped power source line. In FIG. 2, the macro block 101 is surrounded with the power source ring 101A consisting of a ground ring 101a and a power supply ring 101b.

The power source lines 110D extending from the corresponding I/O cells 105 are connected to the power source ring 101A, which is connected to the power source lines 110C that are connected to the cell strings 102.

Figure 3:
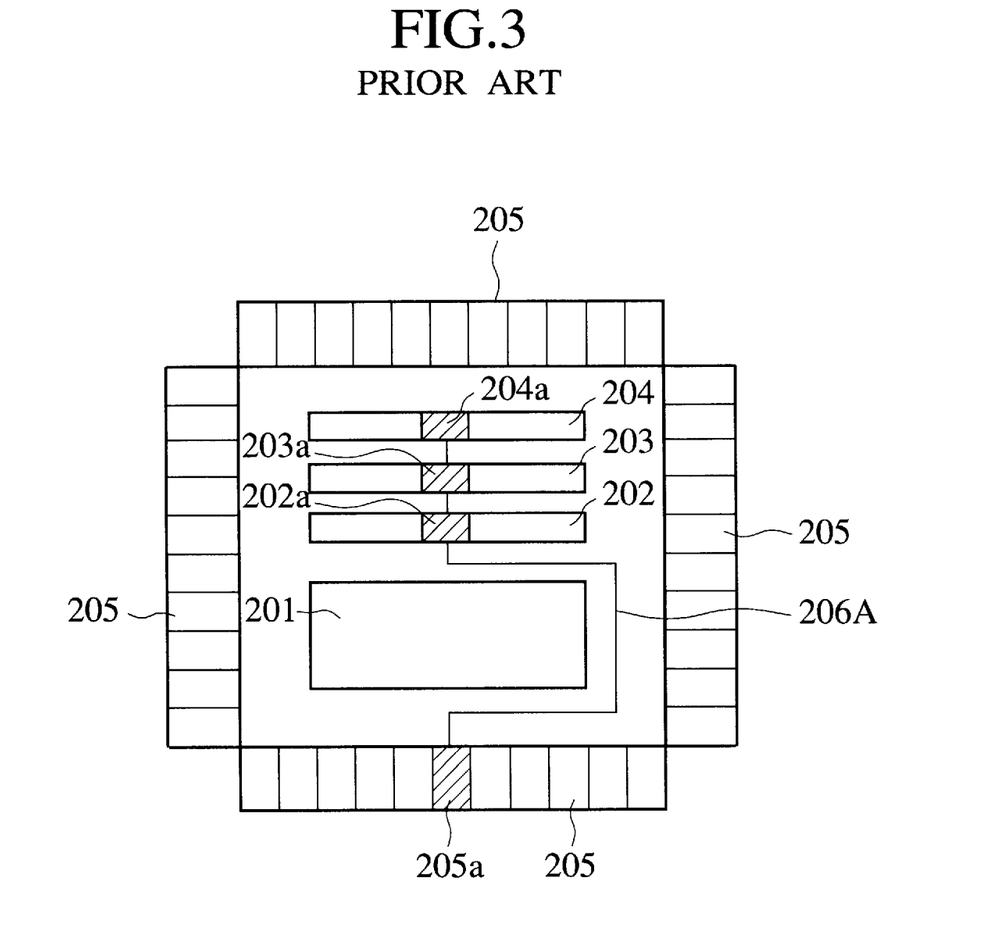
FIG. 3 shows a clock signal line in a semiconductor integrated circuit device according to another prior art.

FIG. 3 shows a clock signal line arranged in a semiconductor integrated circuit device according to another prior art. The device has a macro block 201, cell strings 202, 203, and 204, and I/O cells 205. These elements correspond to those of FIG. 1. The I/O cells 205 include an internal clock generator 205a made of, for example, a PLL circuit for generating an internal clock signal, which is supplied to the cell strings 202 to 204.

The macro block 201 is arranged between the internal clock generator 205a and a cell string area where the cell strings 202 to 204 are formed. As a result, the clock signal line from the generator 205a must detour around the macro block 201 to the cell string area.

The internal clock signal generated by the generator 205a is passed through the clock signal line 206A to clock buffers 202a to 204a, which drive the clock signal and supply the same to the respective cell strings 202 to 204. The problems of these prior arts will be explained.

(1) In the prior art of FIG. 1, power passing through the power source lines 110A is directly supplied to the cell strings 102 for the full width of the lines 110A. On the other hand, power passing through the power source lines 110D is indirectly supplied to the cell strings 102 through the power source ring 101A due to the presence of the macro block 101. The reason of using the ring 101A instead of making a detour around the macro block 101 is to reduce the area of the device.

The width of the power source ring 101A determines the quantity of power supplied to the cell strings 102 through the power source lines 110C, which connect the ring 101A to the cell strings 102. If the total width "P1+P2+P3" (FIG. 2) of the lines 110C is greater than the width P0 of the ring 101A, the quantity of power supplied to the cell strings 102 will be short. Namely, the width of the ring 101A must be greater than the total width of the lines 110C, to prevent a power supply shortage.

(2) In the prior art of FIG. 3, the clock signal line 206A extending from the internal clock generator 205a detours around the macro block 201. This arrangement increases the area of the device, elongates the line 206A, and worsens a clock skew.

SUMMARY OF THE INVENTION

An object of the present invention is to provide a semiconductor integrated circuit device having power source lines that are capable of supplying sufficient power to a cell string area without increasing the area of the device.

Another object of the present invention is to provide a semiconductor integrated circuit device having a clock signal line that is capable of supplying a clock signal to a cell string area through the shortest route to reduce the area of the device.

In order to accomplish the objects, the present invention provides a semiconductor integrated circuit device having an I/O cell area formed at the periphery of the device, to transmit and receive signals to and from the outside of the device, a cell string area containing cell strings each made of a sequence of logic gate cells and connected to power source lines extending from the I/O cell area, a macro block formed between the I/O cell area and the cell string area, to provide at least one function, bridging power source lines extending from part of the I/O cell area, which is opposite to the cell string area across the macro block, to the cell string area by passing over the macro block, and an insulation layer formed between the macro block and the bridging power source lines, to electrically isolate the macro block from the bridging power source lines.

This arrangement supplies power from the part of the I/O cell area, which is opposite to the cell string area across the macro block, to the cell string area directly without passing through a power source ring formed around the macro block.

The bridging power source lines may form a single route for supplying power from the part of the I/O cell area, which is opposite to the cell string area across the macro block, to the cell string area.

Namely, power supply to the cell string area from the macro block side may be made through the single route formed of the bridging power source lines.

Another aspect of the present invention provides a semiconductor integrated circuit device having an I/O cell area formed at the periphery of the device, to transmit and receive signals to and from the outside of the device, a cell string area containing cell strings each made of a sequence of logic gate cells and connected to power source lines extending from the I/O cell area, a macro block formed between the I/O cell area and the cell string area, to provide at least one function, a multilayer wiring structure involving the I/O cell area, cell string area, and macro block that are formed in respective element forming regions on a substrate, a first power source line formed in a first layer of the multilayer wiring structure and extending from part of the I/O cell area, which is opposite to the cell string area across the macro block, toward the macro block, a second power source line formed above the macro block in a third layer of the multilayer wiring structure, the third layer being formed on an insulation film that is formed on a second layer of the multilayer wiring structure, and a third power source line formed in one of the first and second layers of the multilayer wiring structure and extending from the cell string area. The first, second, and third power source lines are connected in series to transmit power from the part of the I/O cell area to the cell string area.

Still another aspect of the present invention provides a semiconductor integrated circuit device having an I/O cell area formed at the periphery of the device, to transmit and receive signals to and from the outside of the device, a cell string area containing cell strings each made of a sequence of logic gate cells and connected to power source lines extending from the I/O cell area, a macro block formed between the I/O cell area and the cell string area, to provide at least one function, a bridging signal line extending from part of the I/O cell area, which is opposite to the cell string area across the macro block, to the cell string area by passing over the macro block, to transmit a special signal, and an insulation layer formed between the macro block and the bridging signal line, to electrically isolate the macro block from the bridging signal line.

The macro block may be an obstacle when arranging a signal line from the I/O cell area to the cell string area. In this case, the aspect mentioned above arranges straight the signal line over the macro block, to set the shortest route for the signal line, thereby reducing the area of the device.

Still another aspect of the present invention provides a semiconductor integrated circuit device having an I/O cell area formed at the periphery of the device, to transmit and receive signals to and from the outside of the device, a cell string area containing cell strings each made of a sequence of logic gate cells and connected to power source lines extending from the I/O cell area, a macro block formed between the I/O cell area and the cell string area, to provide at least one function, a multilayer wiring structure involving the I/O cell area, cell string area, and macro block that are formed in respective element forming regions on a substrate, a first signal line formed in a first layer of the multilayer wiring structure and extending from part of the I/O cell area, which is opposite to the cell string area across the macro block, toward the macro block, a second signal line formed above the macro block in a third layer of the multilayer wiring structure, the third layer being formed on an insulation film that is formed on a second layer of the multilayer wiring structure, and a third signal line formed in one of the first and second layers of the multilayer wiring structure and extending from the cell string area. The first, second, and third signal lines are connected in series to transmit a special signal from the part of the I/O cell area to the cell string area.

The special signal may be a clock signal.

The signal lines transmit the clock signal from the I/O cell area to the cell string area through the shortest route that passes over the macro block, to thereby reduce a clock skew.

DETAILED DESCRIPTION OF THE EMBODIMENTS

The embodiments of the present invention will be explained with reference to the accompanying drawings.

Figure 4:
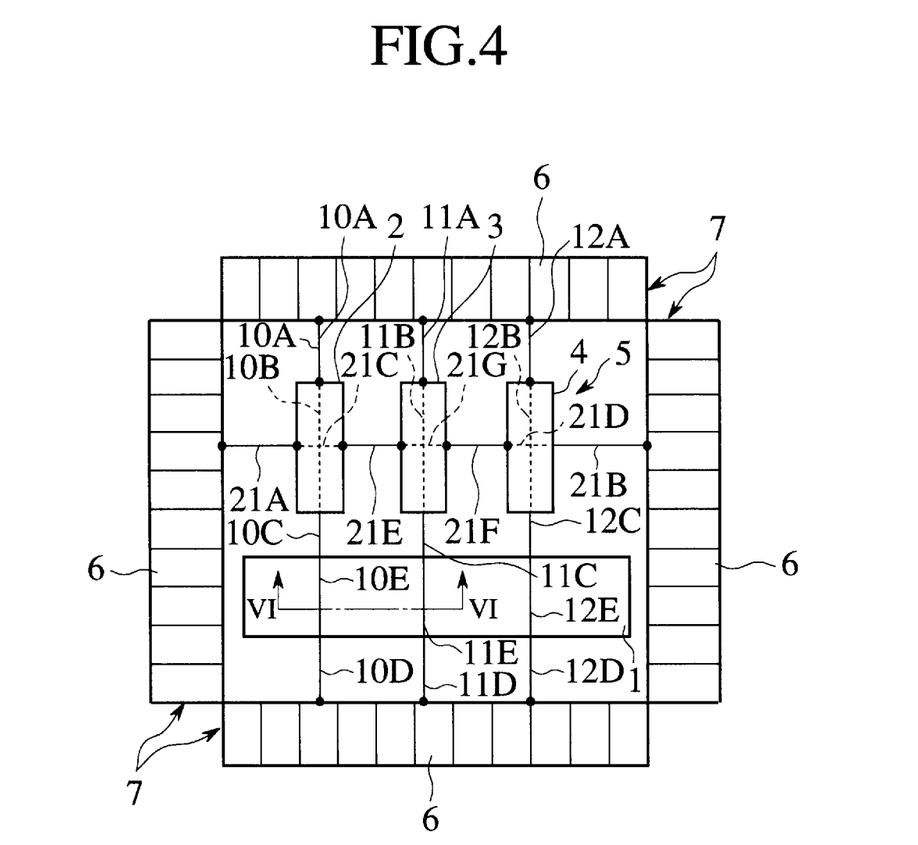
FIG. 4 shows power source lines in a semiconductor integrated circuit device according to a first embodiment of the present invention.

FIG. 4 shows power source lines in a semiconductor integrated circuit device according to the first embodiment of the present invention.

The device includes a macro block 1, a cell string area 5, and an I/O cell area 7. The macro block 1 contains a CPU, memories, etc., to provide at least one function. The cell string area 5 contains cell strings 2, 3, and 4 each made of a sequence of logic gate cells. The I/O cell area 7 contains I/O cells 6 at the periphery of the device, to transmit and receive signals to and from the outside of the device.

Figure 5:
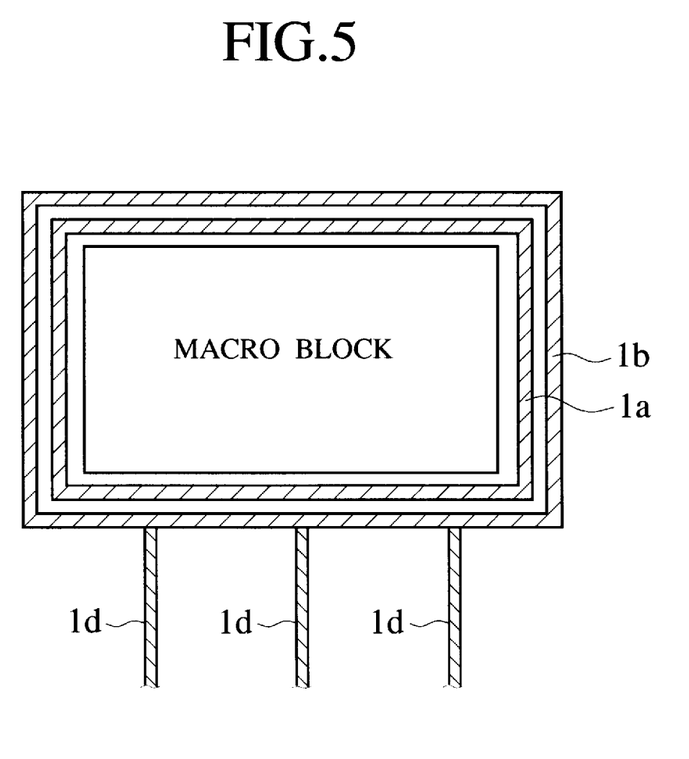
FIG. 5 shows the details of a power source ring formed around a macro block of the device of the first embodiment.

FIG. 5 shows the details of a power source ring formed around the macro block 1.

Due to the limitation of an automatic wiring technique employing CAD, macro blocks are usually provided with a power source ring to supply power thereto. The macro block 1 of FIG. 5 has the power source ring consisting of a ground ring 1a and a power supply ring 1b. The power source ring receives power from the I/O cell area 7 through power source lines id. These lines id are usually formed in a first layer of an Al multilayer wiring structure. Although FIG. 5 shows the routes to the power supply ring 1b, there are similar routes to the ground ring 1a too.

Figure 6:
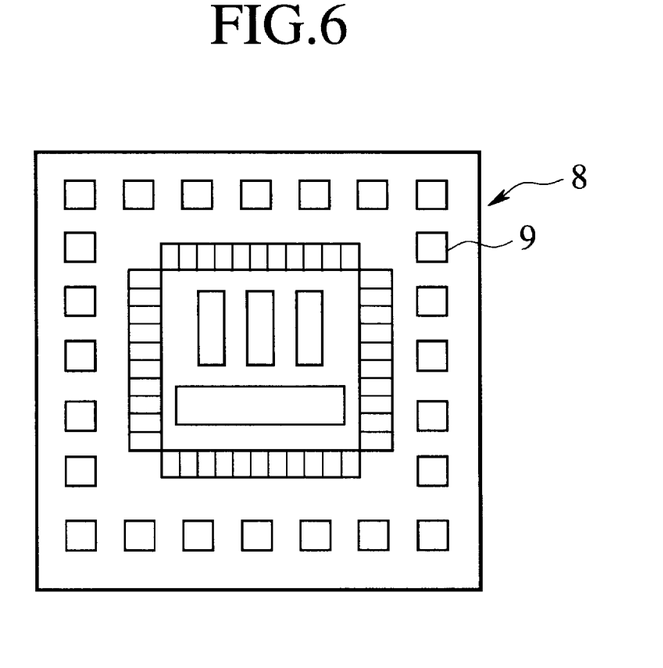
FIG. 6 shows a chip on which the device of the first embodiment is formed.

FIG. 6 shows a chip 8 on which the semiconductor integrated circuit device of FIG. 4 is formed. The periphery of the chip 8 has pads 9, which are electrically connected to a board by, for example, wire-bonding. The pads 9 are connected to the I/O cell area 7 through internal wiring.

Returning to FIG. 4, power supply to the cell strings 2 to 4 is made from the I/O cell area 7. Power source lines (including ground and power supply lines) 10A, 11A, and 12A extending from the I/O cell area 7 are directly connected to the cell strings 2 to 4, respectively. More precisely, the lines 10A to 12A are connected to power source lines 10B to 12B formed inside the cell strings 2 to 4, and the lines 10B to 12B are connected to power source lines 10C to 12C formed between the cell strings 2 to 4 and the macro block 1.

Power source lines 10D, 11D, and 12D extending from the I/O cell area 7 are not connected to the power source ring of the macro block 1, unlike the prior art of FIG. 2. Instead, the lines 10D to 12D are connected to power source lines 10E to 12E that pass over the macro block 1, and the lines 10E to 12E are connected to the lines 10C to 12C that are connected to the cell strings 2 to 4. The lines 10E to 12E passing over the macro block 1 are so arranged not to cause a short circuit with respect to the macro block 1. For this purpose, the lines 10D to 12D are independent of the power source lines 1d of FIG. 5.

The chip 8 has an Al multilayer wiring structure in which the power source lines 10D to 12D are formed in a first layer. The lines 10D to 12D are connected to the power source lines 10E to 12E, which are formed in a third layer of the multilayer structure. The third layer is present above the macro block 1 and is electrically isolated therefrom so that the lines 10E to 12E never cause a short circuit with respect to the macro block 1. The lines 10E to 12E are connected to the lines 10C to 12C, which are formed in one of the first and second layers of the multilayer structure. The lines 10C to 12C are connected to the lines 10B to 12B, which are formed in the cell strings 2 to 4.

In this way, power supply from the I/O cell area 7 across the macro block 1 to the cell strings 2 to 4 is made directly through the single route that passes over the macro block 1.

Power source lines 21A and 21B extending sideward from the I/O cell area 7 are connected to power source lines 21C and 21D formed inside the cell strings 2 and 4, and the lines 21C and 21D are connected to inter-cell power source lines 21E and 21F. The lines 21E and 21F are connected to a power source line 21G formed inside the cell string 3.

Figure 7:
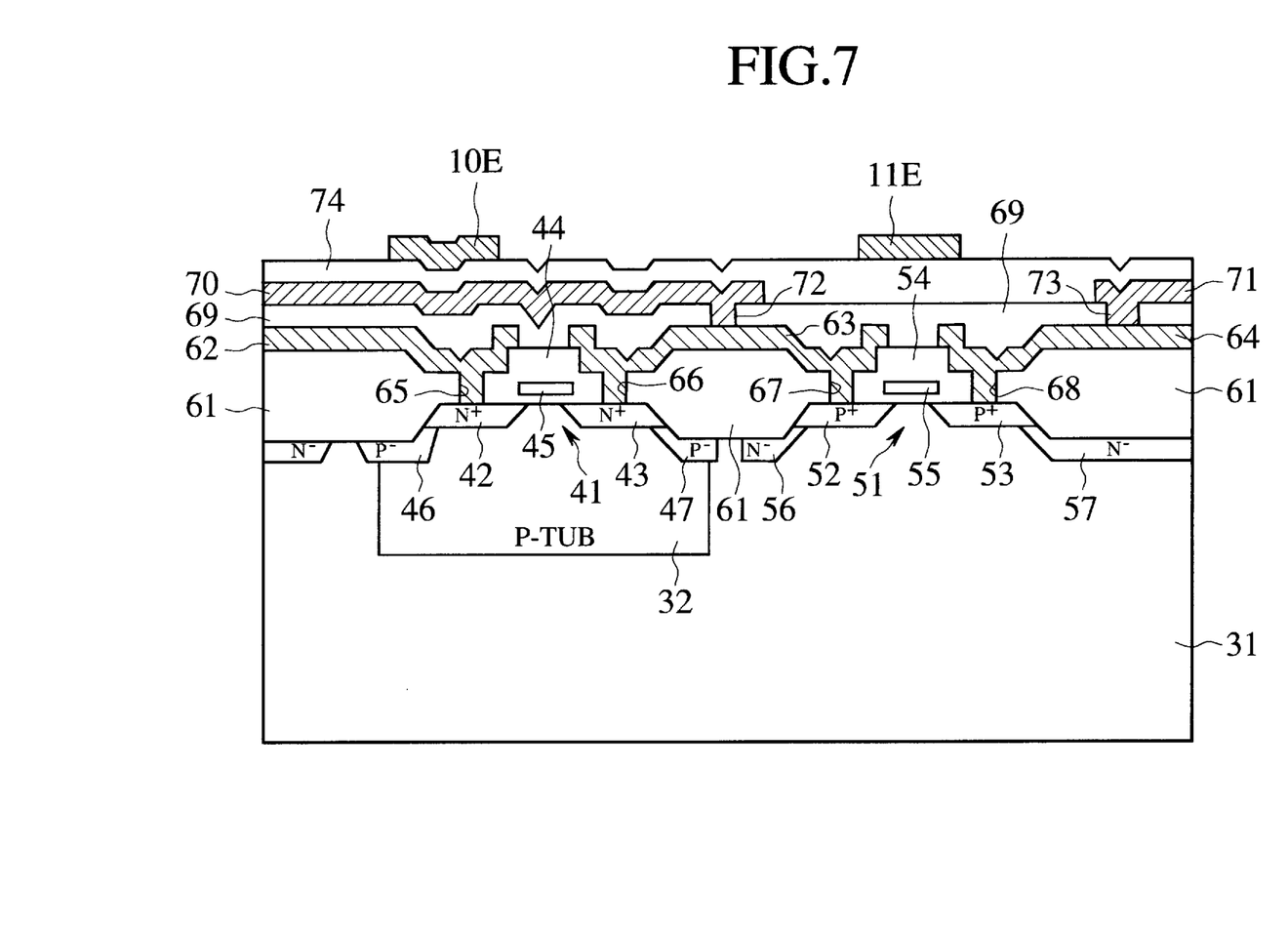
FIG. 7 is a sectional view taken along a line VI—VI of FIG. 4, showing an Al multilayer wiring structure.

FIG. 7 is a sectional view taken along a line VI—VI of FIG. 4, showing the Al multilayer wiring structure of the device.

Just under the power source lines 10E and 11E, the macro block 1 has an n-channel MOS transistor 41 and a p-channel MOS transistor 51 that are formed on a substrate 31.

In the area of the transistor 41, a p-type layer 32 is formed on the principal surface of the substrate 31. The p-type layer 32 contains n⁺-type diffusion layers 42 and 43 serving as drain and source regions. An $SiO_2$ layer 44 is formed on the diffusion layers 42 and 43 by, for example, CVD, to cover a polysilicon gate electrode 45. Beside the diffusion layers 42 and 43, p⁻-type diffusion layers 46 and 47 serving as channel switches are formed.

In the area of the transistor 51, p⁺-type diffusion layers 52 and 53 serving as drain and source regions are formed. On the diffusion layers 52 and 53, an $SiO_2$ layer 54 is formed by, for example, CVD, to cover a polysilicon gate electrode 55. Beside the diffusion layers 52 and 53, p⁻-type diffusion layers 56 and 57 serving as channel switches are formed.

The transistors 41 and 51 are isolated from each other with a field oxide ($SiO_2$) film 61. On the field oxide film 61, there is formed the first layer of the multilayer wiring structure that includes Al wiring patterns 62, 63, and 64 formed by, for example, vapor deposition. The diffusion layer 42 of the transistor 41 is connected to the Al wiring pattern 62 through a contact hole 65, and the diffusion layer 43 of the same transistor is connected to the Al wiring pattern 63 through a contact hole 66. The diffusion layer 52 of the transistor 51 is connected to the Al wiring pattern 63 through a contact hole 67, and the diffusion layer 53 of the same transistor is connected to the Al wiring pattern 64 through a contact hole 68.

The first layer that includes the Al wiring patterns 62 to 64 is covered with an interlayer insulation film 69 on which the second layer of the multilayer wiring structure is formed. The second layer includes Al wiring patterns 70 and 71. The Al wiring pattern 70 of the second layer is connected to the Al wiring pattern 63 of the first layer through a contact hole 72. The Al wiring pattern 71 of the second layer is connected to the Al wiring pattern 64 of the first layer through a contact hole 73.

The second layer that includes the Al wiring patterns 70 and 71 is covered with an interlayer insulation film 74 on which the third layer of the multilayer wiring structure that is characteristic to the present invention is formed. The third layer includes Al wiring patterns, i.e., the power source lines 10E, 11E, and 12E (12E is not shown in FIG. 7).

Consequently, the power source lines 10D to 12D extending from the I/O cell area 7 are connected to the power source lines 10E to 12E passing over the macro block 1, and the lines 10E to 12E are connected to the power source lines 10C to 12C, which are connected to the cell strings 2 to 4.

In this way, the power source lines 10D to 12D blocked by the macro block 1 on the way to the cell strings 2 to 4 are not connected to the power source ring (FIG. 5) formed around the macro block 1. Instead, the lines 10D to 12D supply power to the cell strings 2 to 4 through the lines 10E to 12E that pass over the macro block 1. This arrangement supplies sufficient power to the cell strings 2 to 4 without increasing the area of the chip 8.

This embodiment uses the first and second layers of the Al multilayer wiring structure for device's original purposes and the third layer thereof for passing over the macro block 1. If the first to third layers of the Al multilayer wiring structure are needed for device's original purposes, the power source lines 10E, 11E, and 12E of the present invention may be formed in a fourth layer of the multilayer wiring structure.

A semiconductor integrated circuit device according to the second embodiment of the present invention will be explained.

This embodiment is characterized by power source lines that supply power from an I/O cell area to cell string areas.

Figure 8:
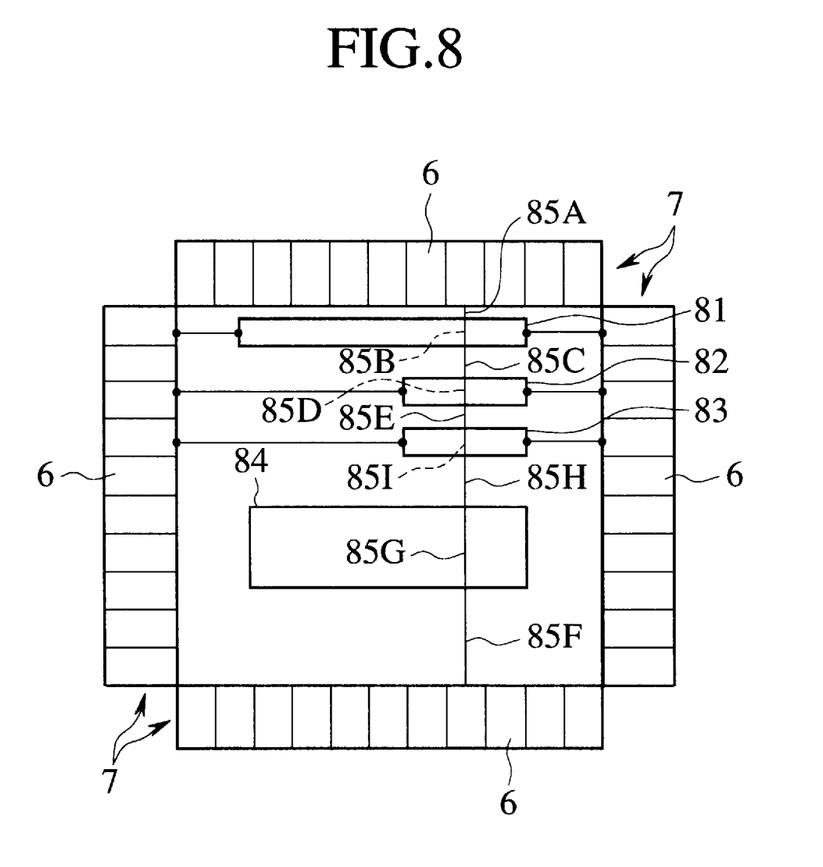
FIG. 8 shows a power source line in a semiconductor integrated circuit device according to a second embodiment of the present invention.

FIG. 8 shows the power source lines of the device of the second embodiment.

The device has cell string areas 81, 82, and 83 each having cell strings each consisting of a sequence of logic gate cells, and a macro block 84. The macro block 84 corresponds to the macro block 1 of FIG. 4 and is arranged between the I/O cell area 7 and the cell string area 83.

Power supply to the cell string areas 81 to 83 is made from the I/O cell area 7.

A power source line 85A extends from one I/O cell 6 in the I/O cell area 7 directly to the adjacent cell string area 81. More precisely, the line 85A is connected to a power source line 85B formed in the cell string area 81, and the line 85B is connected to a power source line 85C arranged between the cell string areas 81 and 82. The line 85C is connected to a power source line 85D formed in the cell string area 82, and the line 85D is connected to a power source line 85E arranged between the cell string areas 82 and 83.

On the other hand, a power source line 83F extending from one I/O cell 6 in the I/O cell area 7 is connected to a power source line 85G, which passes over the macro block 84 without connected to a power source ring formed around the macro block 84. The line 85G is connected to a power source line 85H arranged between the macro block 84 and the cell string area 83. The line 85H is connected to a power source line 85I formed in the cell string area 83, and the line 85I is connected to the line 85E arranged between the cell string areas 82 and 83.

In this way, the cell string areas 81 to 83 receive power from the I/O cell area 7 through various power source lines. Among the power source lines, the one blocked by the macro block 84 passes the single route that runs over the macro block 84, to provide the same effect as the first embodiment.

Figure 9:
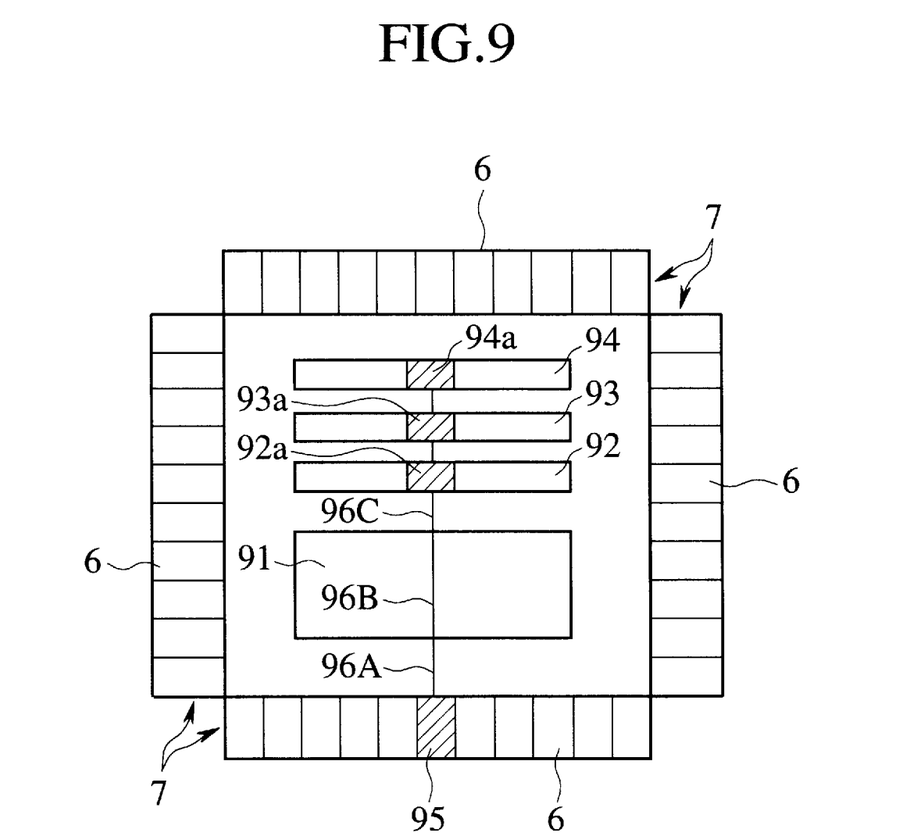
FIG. 9 shows a clock signal line in a semiconductor integrated circuit device according to a third embodiment of the present invention.

FIG. 9 shows a clock signal line of a semiconductor integrated circuit device according to the third embodiment of the present invention.

The device has a macro block 91, cell strings 92, 93, and 94, and an I/O cell area 7 that contains I/O cells 6. These elements correspond to those of the first embodiment. The I/O cell area 7 beside the macro block 91 opposite to the cell strings 92 to 94 includes an internal clock generator 95 made of, for example, a PLL circuit for generating an internal clock signal to be supplied to the cell strings 92 to 94. The macro block 91 is present between the clock generator 95 and the cell strings 92 to 94.

The clock signal line from the clock generator 95 to the cell strings 92 to 94 extends straight over the macro block 91.

The device has an Al multilayer wiring structure. A clock signal line 96A extending from the clock generator 95 toward the macro block 91 is formed in a first layer of the multilayer wiring structure. The line 96A is connected to a clock signal line 96B formed in a third layer of the multilayer wiring structure. The third layer is electrically isolated from the macro block 91 so that the line 96B may cause no internal short-circuit. The line 96B passes over the macro block 91 and is connected to a clock signal line 96C formed in one of the first and second layers of the multilayer wiring structure. The line 96C is connected to clock buffers 92a, 93a, and 94a contained in the cell strings 92 to 94. The clock buffers 92a to 94a supply the clock signal to the clock terminals of sequential circuits in the cell strings 92 to 94. The multilayer wiring structure of the third embodiment is similarly constructed as that of FIG. 7.

The internal clock signal generated by the clock generator 95 is passed through the clock signal lines 96A, 96B, and 96C and is supplied to the clock buffers 92a to 94a, which drive the signal and supply the same to the sequential circuits of the cell strings 92 to 94.

Unlike the prior art of FIG. 3 that makes a detour of the signal line 206A around the macro block 201, the third embodiment extends the signal line straight over the macro block 91, to thereby reduce the area of the device, greatly shorten the clock signal line, and eliminate a clock skew.

What is claimed is:

1. A semiconductor integrated circuit device comprising:
    an I/O cell area formed at the periphery of the device, to transmit and receive signals to and from the outside of the device;
    a cell string area containing cell strings each made of a sequence of logic gate cells and connected to power source lines extending from said I/O cell area;
    a macro block formed between said I/O cell area and said cell string area, to provide at least one function;
    bridging power source lines extending from part of said I/O cell area, which is opposite to said cell string area across said macro block, to said cell string area by passing over said macro block; and
    an insulation layer formed between said macro block and said bridging power source lines, to electrically isolate said macro block from said bridging power source lines.

2. The semiconductor integrated circuit device of claim 1, wherein said bridging power source lines form a single route for supplying power from the part of said I/O cell area, which is opposite to said cell string area across said macro block, to said cell string area.

3. A semiconductor integrated circuit device comprising:
    an I/O cell area formed at the periphery of the device, to transmit and receive signals to and from the outside of the device;
    a cell string area containing cell strings each made of a sequence of logic gate cells and connected to power source lines extending from said I/O cell area;
    a macro block formed between said I/O cell area and said cell string area, to provide at least one function;
    a multilayer wiring structure involving said I/O cell area, cell string area, and macro block that are formed in respective element forming regions on a substrate;
    a first power source line formed in a first layer of said multilayer wiring structure and extending from part of said I/O cell area, which is opposite to said cell string area across said macro block, toward said macro block;
    a second power source line formed above said macro block in a third layer of said multilayer wiring structure, the third layer being formed on an insulation film that is formed on a second layer of said multilayer wiring structure; and
    a third power source line formed in one of the first and second layers of said multilayer wiring structure and extending from said cell string area, said first, second, and third power source lines being connected in series to transmit power from the part of said I/O cell area to said cell string area.

4. A semiconductor integrated circuit device comprising:
    an I/O cell area formed at the periphery of the device, to transmit and receive signals to and from the outside of the device;
    a cell string area containing cell strings each made of a sequence of logic gate cells and connected to power source lines extending from said I/O cell area;
    a macro block formed between said I/O cell area and said cell string area, to provide at least one function;
    a bridging signal line extending from part of said I/O cell area, which is opposite to said cell string area across said macro block, to said cell string area by passing over said macro block, to transmit a special signal; and
    an insulation layer formed between said macro block and said bridging signal line, to electrically isolate said macro block from said bridging signal line.

5. A semiconductor integrated circuit device comprising:
    an I/O cell area formed at the periphery of the device, to transmit and receive signals to and from the outside of the device;
    a cell string area containing cell strings each made of a sequence of logic gate cells and connected to power source lines extending from said I/O cell area;
    a macro block formed between said I/O cell area and said cell string area, to provide at least one function;
    a multilayer wiring structure involving said I/O cell area, cell string area, and macro block that are formed in respective element forming regions on a substrate;
    a first signal line formed in a first layer of said multilayer wiring structure and extending from part of said I/O cell area, which is opposite to said cell string area across said macro block, toward said macro block;

a second signal line formed above said macro block in a third layer of said multilayer wiring structure, the third layer being formed on an insulation film that is formed on a second layer of said multilayer wiring structure; and a third signal line formed in one of the first and second layers of said multilayer wiring structure and extending from said cell string area, said first, second, and third signal lines being connected in series to transmit a special signal from the part of said I/O cell area to said cell string area.

6. The semiconductor integrated circuit device of claim 4, wherein the special signal is a clock signal.

7. The semiconductor integrated circuit device of claim 5, wherein the special signal is a clock.

* * * * *